(12) United States Patent
Otaka et al.

(10) Patent No.: US 7,501,892 B2
(45) Date of Patent: Mar. 10, 2009

(54) AMPLIFIER CIRCUIT AND COMMUNICATION DEVICE

(75) Inventors: Shoji Otaka, Yokohama (JP); Yuta Araki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/755,869

(22) Filed: May 31, 2007

(65) Prior Publication Data

US 2008/0068082 A1 Mar. 20, 2008

(30) Foreign Application Priority Data

Sep. 15, 2006 (JP) ............................. 2006-251090

(51) Int. Cl.
*H03F 3/45* (2006.01)
(52) U.S. Cl. ........................ 330/254; 330/253
(58) Field of Classification Search .............. 330/253, 330/254
See application file for complete search history.

(56) References Cited

U.S. PATENT DOCUMENTS 6,331,803 B1 * 12/2001 Zheng et al. ................. 330/254

(Continued)

FOREIGN PATENT DOCUMENTS

JP 03-098304 4/1991

(Continued)

OTHER PUBLICATIONS

Sahota et al, High Dynamic Range Variable-Gain Amplifier for CDMA Wireless Applications, ISSCC Digest of Technical Papers, Feb. 1997, pp. 374-375.

(Continued)

*Primary Examiner*—Khanh V Nguyen
(74) *Attorney, Agent, or Firm*—Amin, Turocy & Calvin, LLP (57) ABSTRACT

An amplifier circuit according to the present invention comprises: a first differential amplifier circuit including a first transistor having a gate terminal forming a first input node, a second transistor having a gate terminal forming a second input node and having a dimensional ratio with respect to the first transistor of K:M (where K>M), and a first current source that supplies a first current to a source terminal of the first transistor and a source terminal of the second transistor; a second differential amplifier circuit including a third transistor having a gate terminal forming a third input node, a fourth transistor having a gate terminal forming a fourth input node and having a dimensional ratio with respect to the third transistor of M:K, and a second current source that supplies a second current to a source terminal of the third transistor and a source terminal of the fourth transistor, the second differential amplifier circuit having a same gain as the first differential amplifier circuit; and a third differential amplifier circuit including a fifth transistor having a gate terminal forming a fifth input node, a sixth transistor having a gate terminal forming a sixth input node and having a dimensional ratio with respect to the fifth transistor of 1:1, and a variable current source that supplies a third current to a source terminal of the fifth transistor and a source terminal of the sixth transistor, wherein the third differential amplifier circuit combines the third current and the fifth transistor so that a gain of the third differential amplifier circuit is greater than a gain of the first differential amplifier circuit when the third current is a first magnitude, and the gain of the third differential amplifier circuit is lower than the gain of the first differential amplifier circuit when the third current is a second magnitude that differs from the first magnitude.

8 Claims, 10 Drawing Sheets

U.S. PATENT DOCUMENTS

| | | | |
|---|---|---|---|
| 6,552,612 B1 * | 4/2003 | Wilson | 330/254 |
| 6,563,383 B1 | 5/2003 | Otaka et al. | |
| 7,031,684 B2 | 4/2006 | Otaka et al. | |
| 7,372,330 B2 * | 5/2008 | Yoshizawa et al. | 330/254 |
| 2006/0141964 A1 | 6/2006 | Otaka et al. | |

FOREIGN PATENT DOCUMENTS

| | | |
|---|---|---|
| JP | 2002-076805 | 3/2002 |
| JP | 2003-198291 | 7/2003 |
| JP | 2003-318676 | 11/2003 |

OTHER PUBLICATIONS

Japanese Office Action dated Aug. 19, 2008 corresponding to U.S. Appl. No. 11/755,869 filed on May 31, 2007.

* cited by examiner

AMPLIFIER CIRCUIT AND COMMUNICATION DEVICE

CROSS REFERENCE TO RELATED APPLICATIONS

This application is based upon and claims the benefit of priority from the prior Japanese Patent Applications No. 2006-251090, filed on Sep. 15, 2006; the entire contents of which are incorporated herein by reference.

BACKGROUND OF THE INVENTION

1. Field of the Invention

The present invention relates to a technique for high-linearization of variable gain amplifiers.

2. Related Art

At a receiver receiving a radio signal, since the power of a radio signal is around 100 dBs, the amplitude of the received signal must be controlled to a predetermined level at an input of an A/D converter that converts a received analog signal into a digital signal.

On the other hand, once the receiving side realizes that excessive input power is being sent, a transmitter also controls transmitting power so that a predetermined level may be received by the receiving side.

Figure 13:
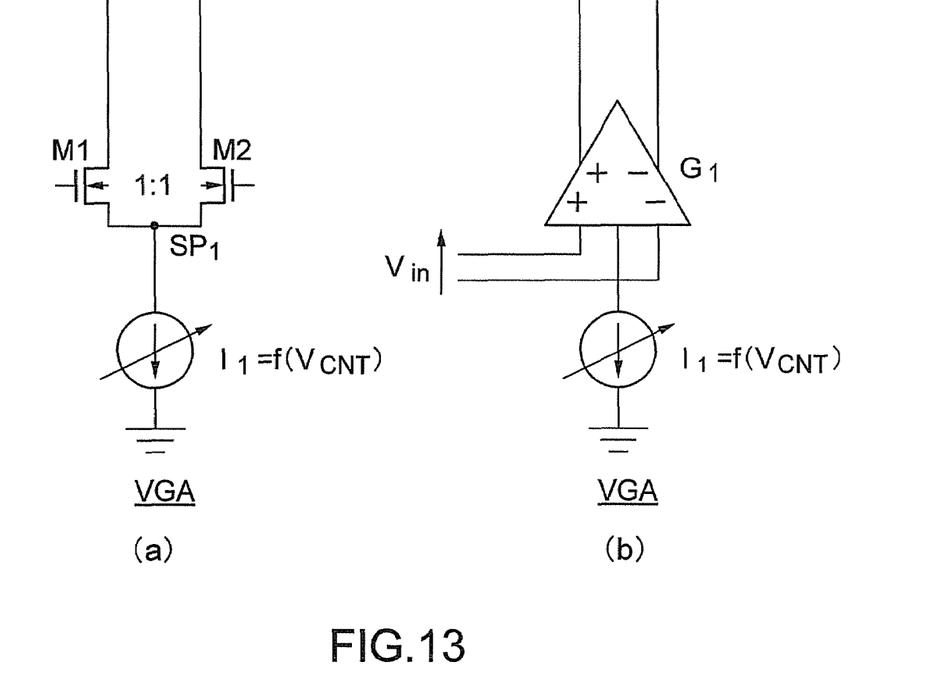
FIG. 13 shows a conventional variable gain amplifier.

Functions for arranging receiver gain or transmitting power to be variable are performed at a variable gain amplifier. A conventional example of a variable gain amplifier VGA is shown in FIG. 13(A). A variable current source $I_1$ is connected between common source terminals of MOS transistors M1 and M2, which form a differential pair SP1, and a ground. Output current is retrieved from drain terminals of the MOS transistors M1 and M2. For simplification of illustration, the differential pair SP1 is shown as in FIG. 13 (B).

Variable gain differs depending on operation regions of the MOS transistors M1 and M2. An operation region in which a gate-source voltage is higher than a threshold voltage and a drain current increases in proportion to square of the gate-source voltage is referred to as a strong inversion region, while an operation region in which a gate-source voltage is lower than a threshold voltage and thus hardly any drain current flows is referred to as a weak inversion region. In the relationship between a gate-source voltage and a drain current, the strong inversion region exhibits a square-law characteristic while the weak inversion region exhibits an exponential characteristic.

When the MOS transistors M1 and M2 have square-law characteristics, a transconductance gm corresponding to gain is given by $$gm = 2\sqrt{(\beta I_d)},$$

where $\beta = (1/2)\mu Cox(W/L)$, $\mu$ is mobility, Cox is oxide film capacitance, "W" is gate width and "L" is gate length. $I_d$ represents the drain current.

When the MOS transistors M1 and M2 have exponential characteristics, the transconductance gm is given by $$gm = I_d/(nV_T),$$

where "n" is a constant related to processes, and VT is thermal voltage, which is 26 mV at room temperature.

An input range of an input voltage Vin, which is formed of a potential difference between voltages respectively applied to gate terminals of the MOS transistors M1 and M2, will now be examined in a case in which the MOS transistors M1 and M2 have square-law characteristics. In this description, for instance, a range in which linearity is maintained (a range in which gain is constant) with small error is used as an input range "R". However, the input range "R" may include a nonlinear range in which linearity is not maintained (a range in which gain varies according to changes in the input voltage Vin).

When the MOS transistor M1 is cut off (no current flow) and a current $I_d$ only flows through the MOS transistor M2, a voltage Vlim across the gate terminals of the MOS transistors M1 and M2 is given by $$Vlim = \sqrt{(I_d/\beta)}.$$

The voltage Vlim will act as an indicator for the input range "R" of the variable gain amplifier (differential amplifier) VGA.

Figure 14:
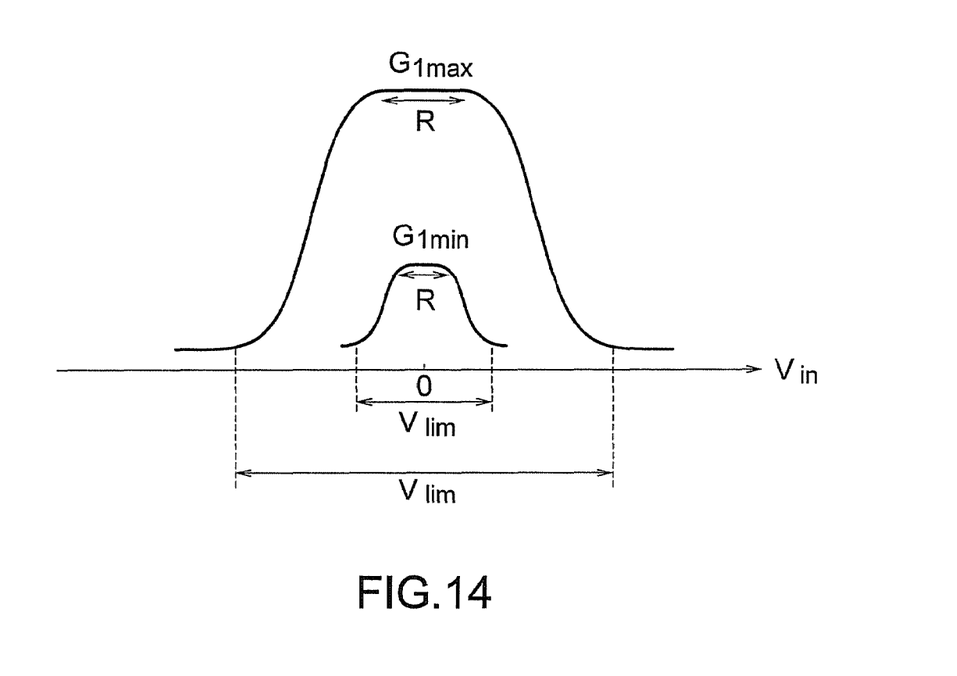
FIG. 14 shows an input range of a conventional variable gain amplifier at maximum gain and minimum gain.

In the above equation expressing the voltage Vlim, decreasing the current $I_d$ in order to lower gain will result in a decrease of Vlim. FIG. 14 shows the voltage Vlim at a transconductance G1max when current $I_d$ is maximized to maximize gain and at a transconductance G1min when current $I_d$ is decreased to minimize gain.

As seen, the lower the gain, the greater the deterioration of the linearity of the variable gain amplifier VGA (in other words, the smaller the input range "R"). However, in this case, it is assumed that the effect of distortion at the output-side of the variable gain amplifier VGA is not considered. By further decreasing the current $I_d$, the square-law characteristic changes to an exponential characteristic. Since the exponential characteristic is almost the same as a characteristic of a bipolar transistor, the input range "R" will decrease to around nVT. Beyond this point, the input range "R" will no longer decrease.

Figure 15:
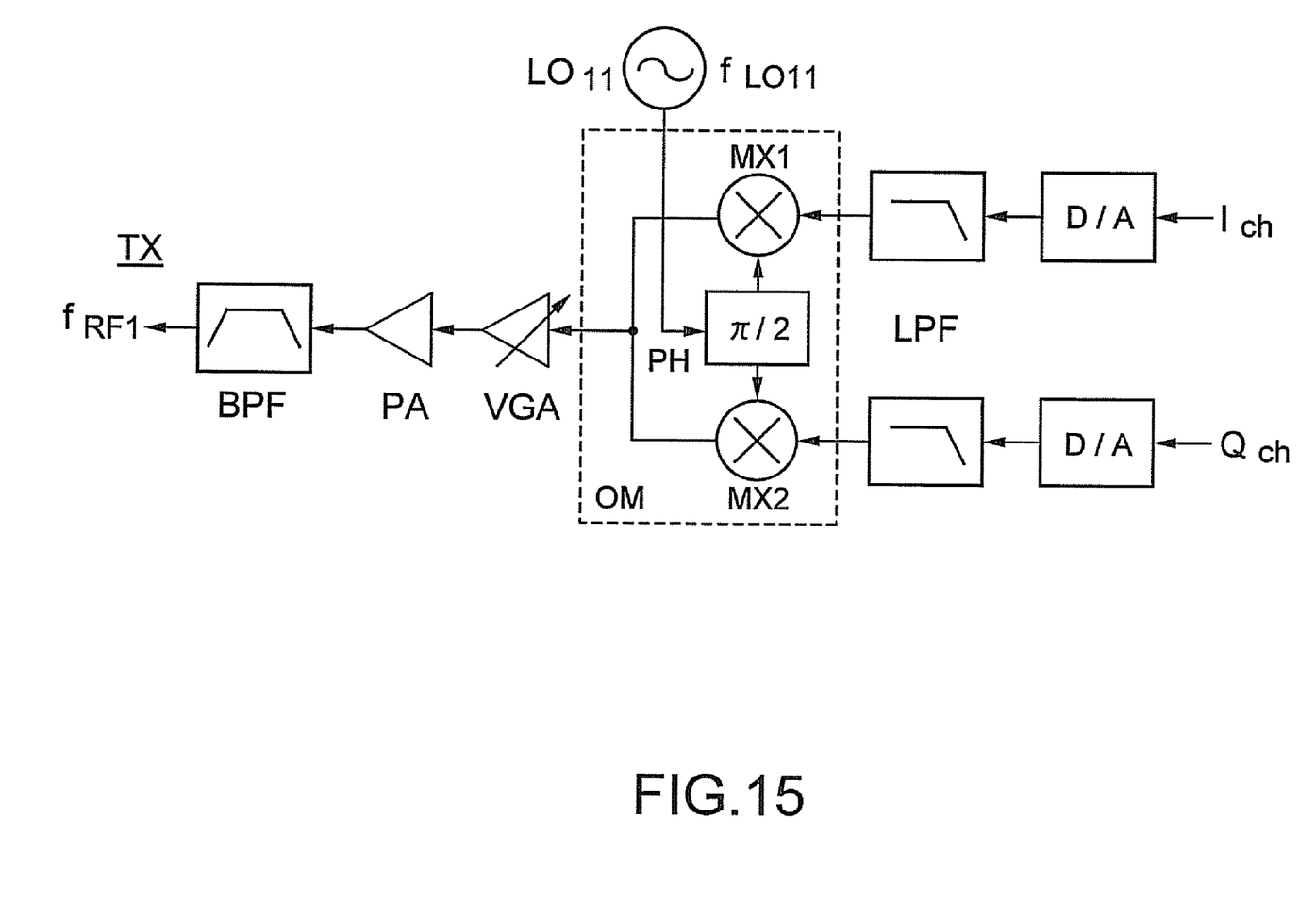
FIG. 15 shows a transmitter using a direct modulation method.

A transmitting section TX using a direct modulation method is shown in FIG. 15. A quadrature modulator OM having mixers MX1 and MX2 and a phase shifter PH modulates an LO signal outputted from a local oscillator LO11 using an I/Q signal obtained sequentially via a D/A converter and an LPF. An output thereof is inputted to the variable gain amplifier VGA, where signal amplitude of the output is adjusted using a control signal. An output of the variable gain amplifier VGA is then amplified by a next-stage power amplifier PA, and radio waves are emitted from an antenna, not shown, via a filter BPF. In this case, the output of the quadrature modulator OM remains constant regardless of power emitted from the antenna.

When using the above-described variable gain amplifier VGA, since lowering gain results in a decrease of the input range "R", the output signal will be distorted. Since distortion of the output signal causes deterioration of modulation accuracy or increase in unwanted radiation, it is necessary to minimize distortion in output signals.

[Patent Document 1] Japanese Patent Laid-Open No. 2001-196880

[Non-Patent Document 1] T. Yamaji, et. al., "A temperature-stable CMOS variable-gain amplifier with 80-dB linearly controlled gain range", IEEE J. Solid-State Circuits, pp. 553-558, May, 2002

SUMMARY OF THE INVENTION

An object of the present invention is to extend linearity (in other words, a range of constant gain) of a variable gain amplifier at low gain.

An amplifier circuit according to an aspect of the present invention is provided with:

a first differential amplifier circuit including a first transistor having a gate terminal forming a first input node, a second transistor having a gate terminal forming a second input node and having a dimensional ratio with respect to the first transistor of K:M (where K>M), and a first current source that supplies a first current to a source terminal of the first transistor and a source terminal of the second transistor;

a second differential amplifier circuit including a third transistor having a gate terminal forming a third input node, a fourth transistor having a gate terminal forming a fourth input node and having a dimensional ratio with respect to the third transistor of M:K, and a second current source that supplies a second current to a source terminal of the third transistor and a source terminal of the fourth transistor, the second differential amplifier circuit having the same gain as the first differential amplifier circuit; and a third differential amplifier circuit including a fifth transistor having a gate terminal forming a fifth input node, a sixth transistor having a gate terminal forming a sixth input node and having a dimensional ratio with respect to the fifth transistor of 1:1, and a variable current source that supplies a third current to a source terminal of the fifth transistor and a source terminal of the sixth transistor, the third differential amplifier circuit combining the third current and the fifth transistor so that a gain of the third differential amplifier circuit is greater than a gain of the first differential amplifier circuit when the third current is a first magnitude, and the gain of the third differential amplifier circuit is lower than the gain of the first differential amplifier circuit when the third current is a second magnitude that differs from the first magnitude; wherein the first input node, the third input node and the fifth input node are mutually connected to form one node of a differential input node;

the second input node, the fourth input node and the sixth input node are mutually connected to form an other node of the differential input node;

a drain terminal of the first transistor, a drain terminal of the third transistor and a drain terminal of the fifth transistor are mutually connected to form one node of a differential output node; and a drain terminal of the second transistor, a drain terminal of the fourth transistor and a drain terminal of the sixth transistor are mutually connected to form an other node of the differential output node.

In addition, an amplifier circuit according to an aspect of the present invention is arranged so that the respective transistors in the above-described amplifier circuit is configured by bipolar transistors, and the gate terminals, source terminals and drain terminals have been respectively replaced by base terminals, emitter terminals and collector terminals.

Furthermore, a communication device according to an aspect of the present invention is a communication device having a transmitter circuit, wherein an amplifier circuit connected to a next stage of a modulator included in the transmitter circuit is configured as the amplifier circuit described above.

DETAILED DESCRIPTION OF THE INVENTION

Embodiments of the present invention will be described below with reference to the accompanying drawings.

Figure 1:
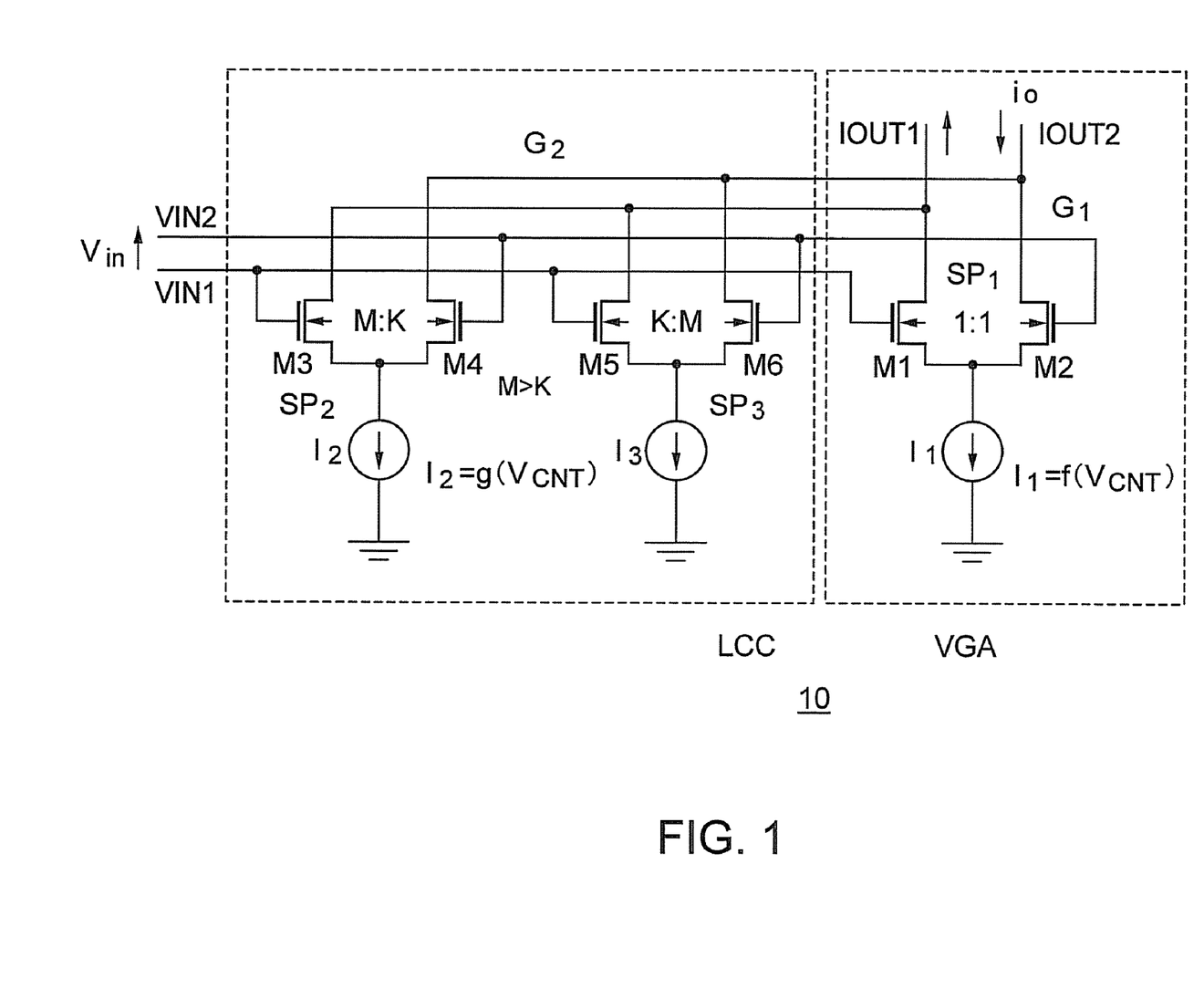
FIG. 1 is a configuration diagram of a variable gain amplifier according to an embodiment of the present invention.

FIG. 1 shows a variable gain amplifier 10 according to an embodiment of the present invention. The variable gain amplifier (i.e. amplifier circuit) 10 is provided with: a variable gain amplifier VGA including first and second transistors M1 and M2 having approximately a same gate width and a first current source I1; and a linearity compensation circuit LCC parallel-connected to the variable gain amplifier VGA and including third and fourth transistors M3 and M4 having different gate widths and a second current source I2, and fifth and sixth transistors M5 and M6 having different gate widths and a third current source I3, wherein the linearity compensation circuit LCC is formed so that a ratio between the gate widths of the third and fourth transistors M3 and M4 is approximately the same as a ratio between the gate widths of the fifth and sixth transistors M5 and M6.

In other words, sources of the first and second transistors M1 and M2 are commonly connected and also connected to the first current source I1, sources of third and fourth transistors M3 and M4 are commonly connected and also connected to the second current source I2, and sources of fifth and sixth transistors M5 and M6 are commonly connected and also connected to the third current source I3.

Gates of the first, third and fifth transistors M1, M3 and M5 are commonly connected and also connected to a first voltage input terminal VIN1, and gates of the second, fourth and sixth transistors M2, M4 and M6 are commonly connected and also connected to a second voltage input terminal VIN2.

Drains of the first, third and fifth transistors M1, M3 and M5 are commonly connected and also connected to a first current output terminal IOUT1, and drains of the second, fourth and sixth transistors M2, M4 and M6 are commonly connected and also connected to a second current output terminal IOUT2.

The first current source I1 creates a first gain control current $I_1$ based on an externally applied gain control signal or, in other words, a gain control voltage $V_{CNT}$, so that the first gain control current $I_1$ decreases as the gain control voltage $V_{CNT}$ increases.

The second and third current sources I2 and I3 respectively generate a second gain control current $I_2$ having approximately a same current value, and have different current characteristics indicating a relationship between the gain control voltage $V_{CNT}$ and the gain control currents $I_1$ to $I_2$ from that of the first current source I1.

The first transistor according to the present invention corresponds to the fifth transistor according to the claims of the present invention. Similarly hereinafter, the second transistor according to the present invention corresponds to the sixth transistor, the third transistor according to the present invention corresponds to the first transistor, the fourth transistor according to the present invention corresponds to the second transistor, the fifth transistor according to the present invention corresponds to the third transistor, and the sixth transistor according to the present invention corresponds to the fourth transistor. In addition, the first current source I1 according to the present embodiment corresponds to the variable current source that supplies the third current, the second current source I2 according to the present embodiment corresponds to the first current source that supplies the first current, and the third current source I3 according to the present embodiment corresponds to the second current source that supplies the second current. Furthermore, the differential pair SP1 according to the present embodiment corresponds to the third differential amplifier circuit, the differential pair SP2 according to the present embodiment corresponds to the first differential amplifier circuit, and the differential pair SP3 according to the present embodiment corresponds to the second differential amplifier circuit. Moreover, the first voltage input terminal VIN1 according to the present embodiment corresponds to one node of the differential input node, the second voltage input terminal VIN2 according to the present embodiment corresponds to the other node of the differential input node, the first current output terminal IOUT1 according to the present embodiment corresponds to one node of the differential output node, and the second current output terminal IOUT2 according to the present embodiment corresponds to the other node of the differential output node. In addition, the differential pair SP1 (the third differential amplifier circuit) combines the gain control circuit $I_1$ (the third current) and the first transistor (the fifth transistor) so that the gain of SP1 with the gain control current $I_1$ (the third current) is greater than the gain of the differential pair SP2 (the first differential amplifier circuit) when the gain control current $I_1$ (the third current) is a first magnitude, and lower than the gain of the differential pair SP3 (the second differential amplifier circuit) when the gain control current $I_1$ (the third current) is a second magnitude that differs from the first magnitude.

The variable gain amplifier G1 (VGA) is configured of a differential amplifier, and the gain control current $I_1$ or a tail current that flows through the variable current source I1 is formed by $f(V_{CNT})$, which is controlled by the gain control voltage $V_{CNT}$. In this case, $f(V_{CNT})$, in which the gain control current $I_1$ exponentially decreases as the gain control voltage $V_{CNT}$ increases, may be given as $f(V_{CNT})=A \exp(-V_{CNT})$.

Meanwhile, the amplifier G2 is configured by parallel-connecting the differential pair SP2 having a gate width ratio of M:K and the differential pair SP3 having a gate width ratio of K:M. The gate lengths of both differential pairs are the same. The gain control current $I_2$ flowing through the respective differential pairs may be expressed with respect to the gain control voltage $V_{CNT}$ as a function $g(V_{CNT})$ that differs from $f(V_{CNT})$.

The amplifier G2 is used for extending the linearity of the variable gain amplifier G1 during low gain, and is referred to as a linearity compensation circuit. The amplifier G2 or the LCC is parallel-connected to the variable gain amplifier G1.

Figure 2:
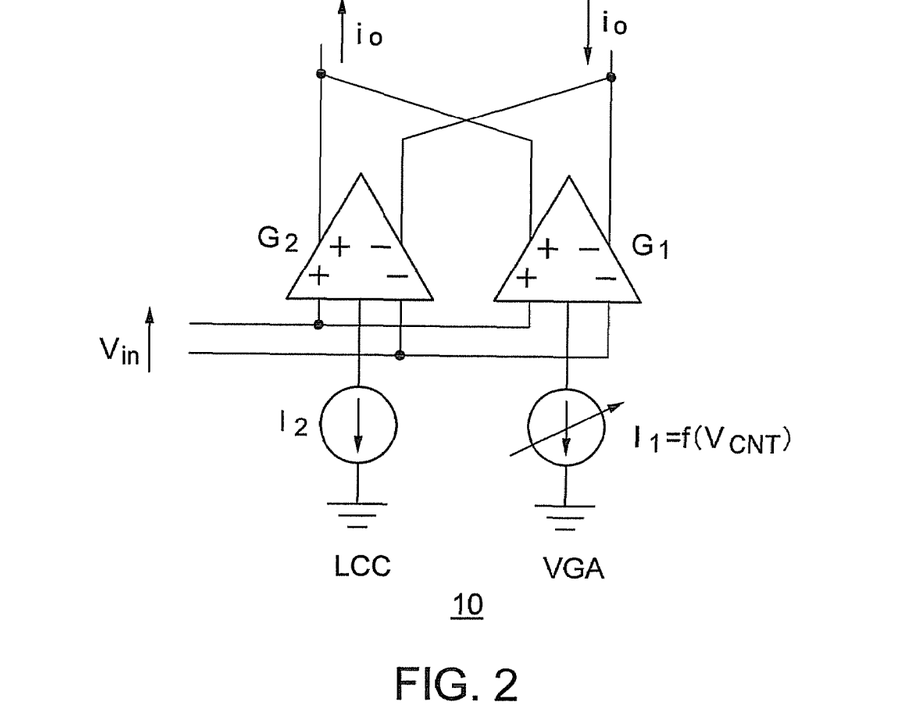
FIG. 2 is a block diagram of the variable gain amplifier according to the embodiment of the present invention.

FIG. 2 shows the differential pair portions of the variable gain amplifier G1 and the amplifier G2 shown in FIG. 1 using simplified symbols. While the amplifier G2 has two gain control currents, only one is shown using the simplified symbols. Operations of a variable gain amplifier 10 will now be described.

As described above, a tail current or, in this case, the gain control current $I_1$ of the variable gain amplifier G1 is given by a current $I_1=A \exp(-V_{CNT})$ that exponentially changes with respect to an externally inputted gain control voltage $V_{CNT}$.

In this case, it is assumed that the gain control voltage $V_{CNT}$ changes from a voltage $V_{CNT0}$ to a voltage $V_{CNT1}$, and the gain control current $I_1$ changes from a maximum value $A \exp(-V_{CNT0})$ to a minimum value $A \exp(-V_{CNT1})$. When the gain control current $I_1$ is maximized, the MOS transistor of the variable gain amplifier G1 operates in a strong inversion region.

This condition means that the size of the MOS transistor of the variable gain amplifier G1 need not be excessively large. In other words, in the strong inversion region, since the density of the current flowing through the MOS transistor is significantly high compared to the weak inversion region, the size of the MOS transistor may be reduced as compared to operating the MOS transistor in the weak inversion region. Therefore, a cutoff frequency fT of the MOS transistor may be increased and a parasitic capacitor of the MOS transistor may be downsized, thereby enabling improvement of high-speed capabilities using a small current.

In this case, the transconductance of the variable gain amplifier G1 may be given as $gm=2\sqrt{(\beta I_1)}$ $(I_1 \approx I_d)$. Thus, the transconductance exponentially changes with respect to $V_{CNT}$. This characteristic shall be hereinafter referred to as a linear-in-dB characteristic. When the gain control voltage is $V_{CNT0}$, the transconductance takes a maximum value G1max. As the gain control voltage $V_{CNT}$ increases, the transconductance gradually decreases and reaches a minimum value G1min at a maximum value $V_{CNT1}$.

Figure 3:
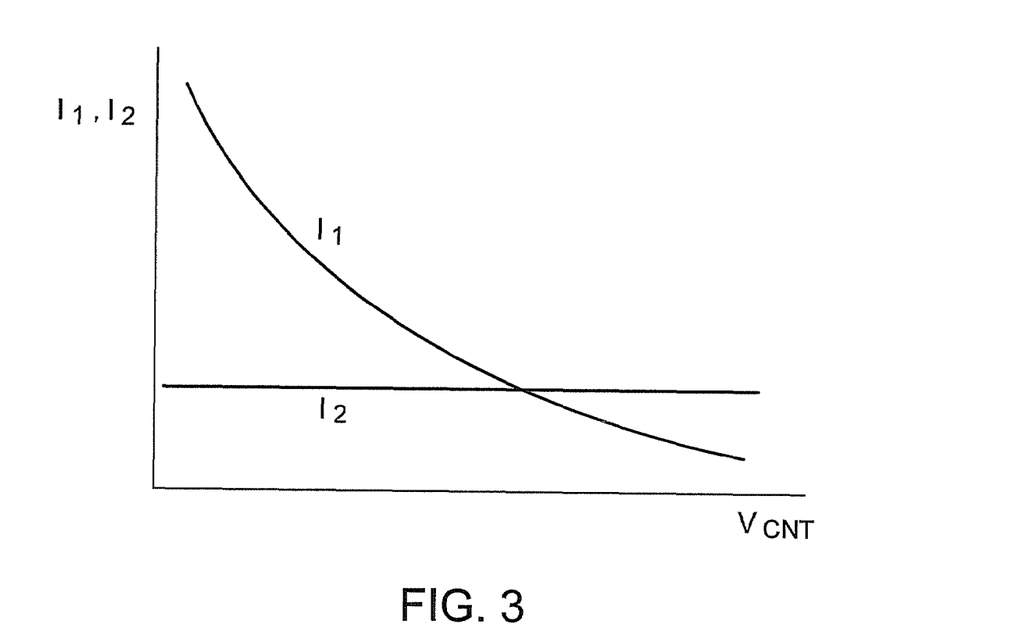
FIG. 3 shows a gain control current $I_1$ of a variable gain amplifier G1 and a gain control current $I_2$ of an amplifier G2.

Next, operations of the LCC or the amplifier G2 will be described using two different cases. First, as shown in FIG. 2, a first method will be described in which the gain control current $I_2$ of the amplifier G2 is kept constant independent of the gain control voltage $V_{CNT}$. The relationship between the gain control currents $I_1$ and $I_2$ and the gain control voltage $V_{CNT}$ in this case is as shown in FIG. 3.

In this case, the first current source I1 generates the first gain control current $I_1$ so as to exponentially decrease the first gain control current $I_1$ as the gain control voltage $V_{CNT}$ increases. The second and third current sources I2 and I3 respectively generate the second gain control current $I_2$ so that the same takes an approximately constant value.

The amplifier G2 has a configuration in which two asymmetrical differential pairs are connected. The gate width ratio M:K of the differential pairs is set so that the respective transconductances gm2 are equal to the transconductance G1min at gain control current $I_2$.

This arrangement allows a constant current $2I_2$ to always flow through the amplifier G2 regardless of the gain control voltage $V_{CNT}$. At an offset voltage VOFF that is expressed as a function of the gate width ratio M:K, the peak of the transconductance gm2 of the amplifier takes a value that is equal to the peak of the transconductance G1min. Note that VOFF=$\{(m-1)/(m+1)\}/\sqrt{(m\beta)}\times I2$, where m=M/K, M>K.

Figure 4:
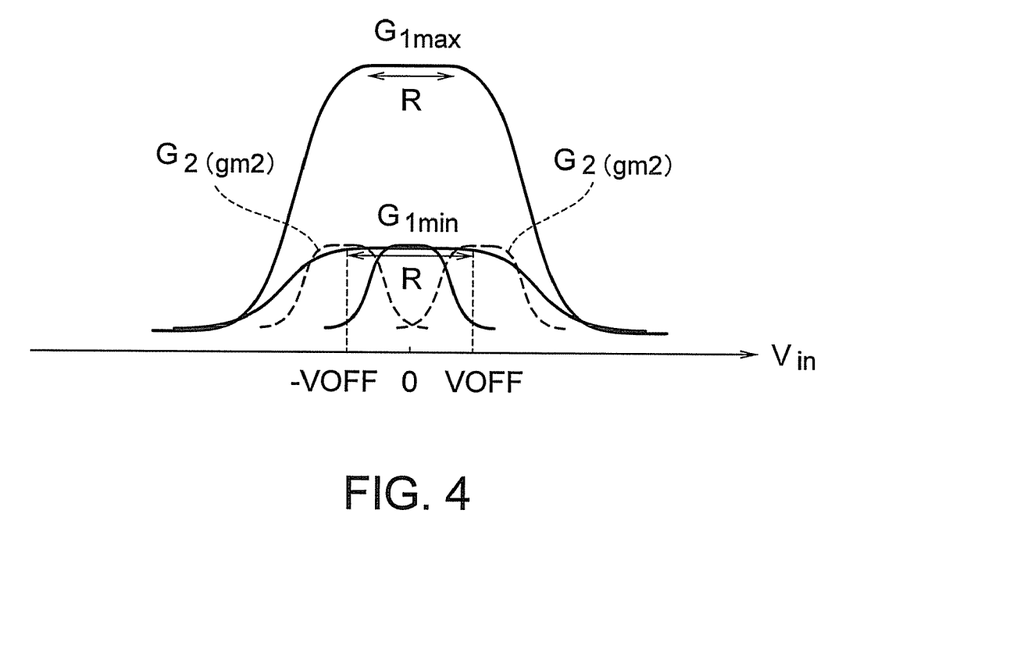
FIG. 4 shows a comparison between an input range of the variable gain amplifier G1 and an input range by the variable gain amplifier G1 and the amplifier G2.

FIG. 4 shows transconductances of the variable gain amplifier G1 and the amplifier G2 at minimum gain and maximum gain. In this description, for instance, a range in which linearity is maintained (a range in which gain is constant) with small error is used as an input range "R". However, the input range "R" may include a nonlinear range in which linearity is not maintained (a range in which gain varies according to changes in the input voltage $V_{in}$).

As is apparent from FIG. 4, since the input range "R" of the variable gain amplifier G1 is wide at maximum gain and the transconductance G1max is high, the small transconductance gm2 of the amplifier G2 may be ignored. Thus, the input range "R" is virtually determined by the transconductance G1max of the variable gain amplifier G1.

On the other hand, by decreasing the gain control current $I_1$ so that the transconductance of the variable gain amplifier G1 is minimized to G1min, the transconductance gm2 of the amplifier G2 will peak at a predetermined offset voltage VOFF, and the peak value will be equal to G1min. In this case, the transconductance G1min of the variable gain amplifier G1 and the two transconductances gm2 of the amplifier G2 are added. As a result, the input range "R" is extended by at least the offset voltage VOFF in a case where the amplifier G2 is removed.

Figure 5:
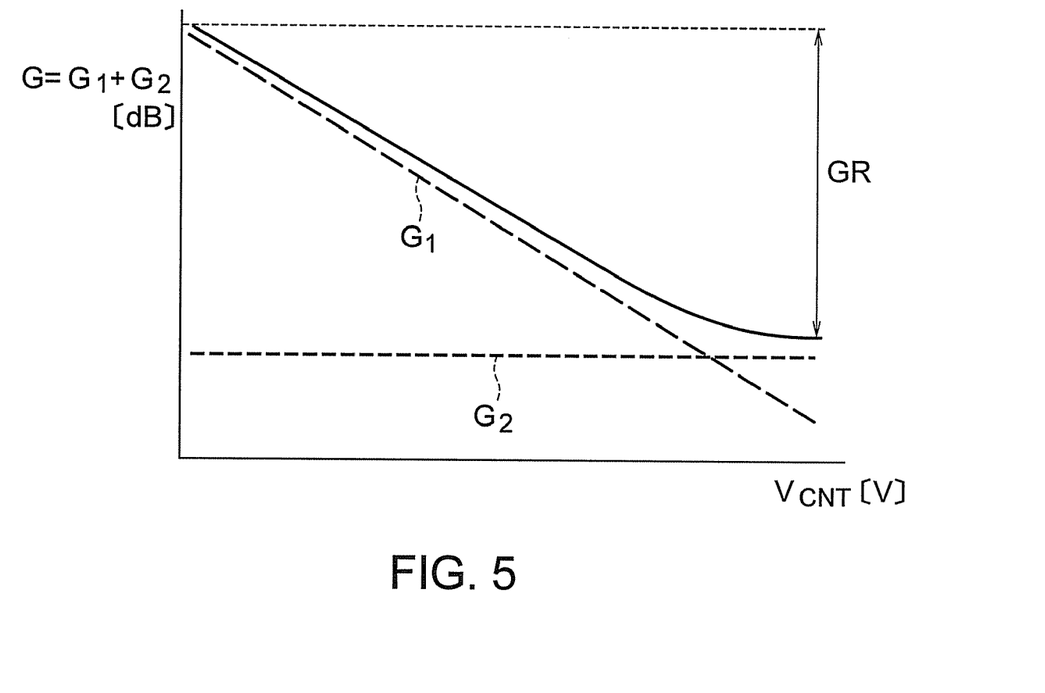
FIG. 5 shows gain control characteristics of the variable gain amplifier G1 and the amplifier G2 having square-law characteristics.

FIG. 5 shows a dependence of gain or, in other words, transconductance with respect to the gain control voltage $V_{CNT}$. When the MOS transistor is operating in the strong inversion region when the variable gain amplifier G1 is at minimum gain (in other words, when operating in the strong inversion region for all gains), the $V_{CNT}$ dependence of the variable gain amplifier G1 indicates a linear-in-dB characteristic that is represented by a straight line graph when logarithm is taken on the vertical axis.

In this case, since the transconductance of the amplifier G2 is constant, a transconductance "G" of the entire variable gain amplifier 10 may slightly increase near minimum gain. This is due to the fact that the transconductance of the amplifier G2 near the offset voltage VOFF=0V ($V_{in}$=0) is added to the transconductance of the variable gain amplifier G1.

Therefore, the transconductance G=G1+G2 of the entire variable gain amplifier 10 will be higher than the minimum value of the variable gain amplifier G1. However, since this deviation is inevitable and may be anticipated, the deviation may be avoided by adjusting the gain control voltage $V_{CNT}$. In addition, in a case where high accuracy is not required for gain control characteristics, the smallness of the deviation of gain control characteristics will not pose any problems.

A method for enhancing the accuracy of the linear-in-dB characteristic will now be described. In this case, within a gain range in which gain is changeable by the variable gain amplifier VGA, the variable gain amplifier VGA operates the first and second transistors M1 and M2 in the strong inversion region near maximum gain, and in the weak inversion region near minimum gain.

When operations are set to be performed in the weak inversion region at near minimum gain Gmin of the variable gain amplifier G1, the gain control characteristic of the variable gain amplifier G1 will start to deviate from a linear-in-dB characteristic. In other words, when a transition is made from the strong inversion region to the weak inversion region, the slope of the linear-in-dB characteristic becomes precipitous as the slope transits from 1 to 2.

Figure 6:
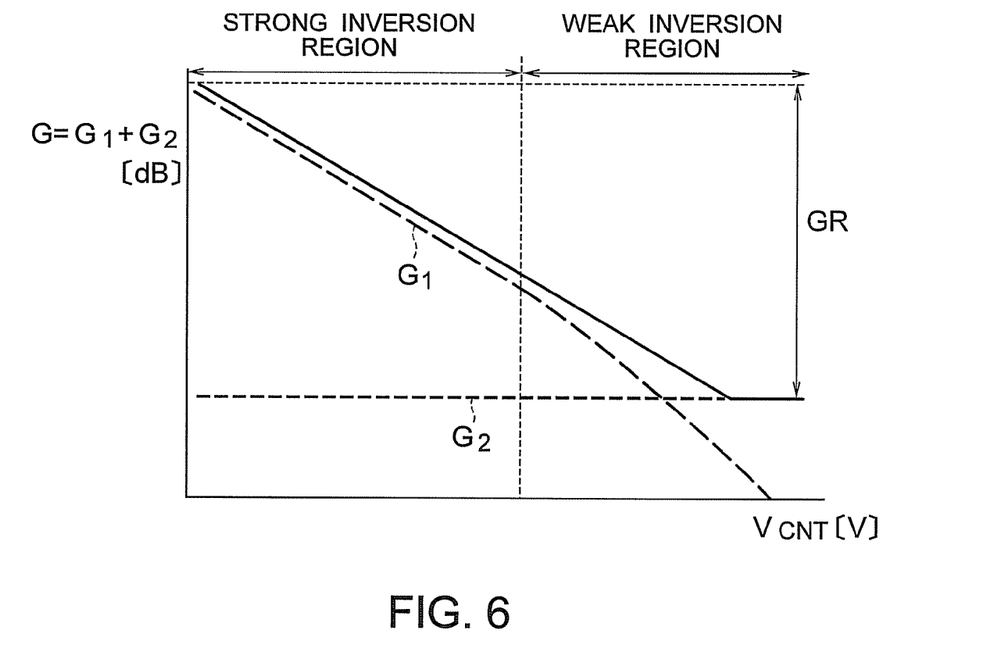
FIG. 6 shows gain control characteristics of the variable gain amplifier G1 and the amplifier G2 having square-law characteristics and exponential characteristics.

This characteristic is shown in FIG. 6. As seen, in a case in which the transconductance Gmin is set in the weak inversion region, the slope of the linear-in-dB characteristic of the variable gain amplifier G1 changes. However, by taking advantage of the fact that the transconductance of the entire variable gain amplifier 10 increases under the effect of the transconductance of the amplifier G2, a range of the linear-in-dB characteristic (a gain range GR in which gain is changeable) may be extended as compared to the case of FIG. 5.

Figure 7:
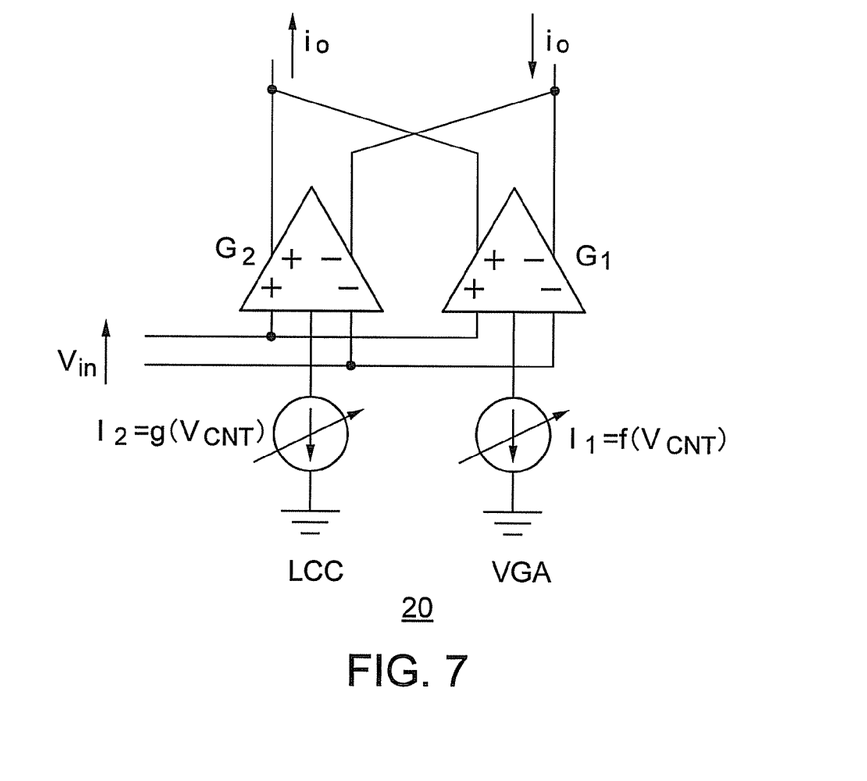
FIG. 7 is a block diagram of the variable gain amplifier according to the embodiment of the present invention.

Next, as shown in FIG. 7, a second method will be described in which the gain control current $I_2$ of the amplifier G2 is dependent on the gain control voltage $V_{CNT}$. In FIG. 7, since the gain control current $I_2$ differs from the gain control current $I_1$, the gain control current $I_2$ is expressed as $I_2$=g($V_{CNT}$).

In this case, the first current source I1 generates the first gain control current $I_1$ so as to exponentially decrease the first gain control current $I_1$ as the gain control voltage $V_{CNT}$ increases. The second and third current sources I2 and I3 respectively generate the second gain control current $I_2$ so that the second gain control current $I_2$ monotonously increases as the gain control voltage $V_{CNT}$ increases.

Figure 8:
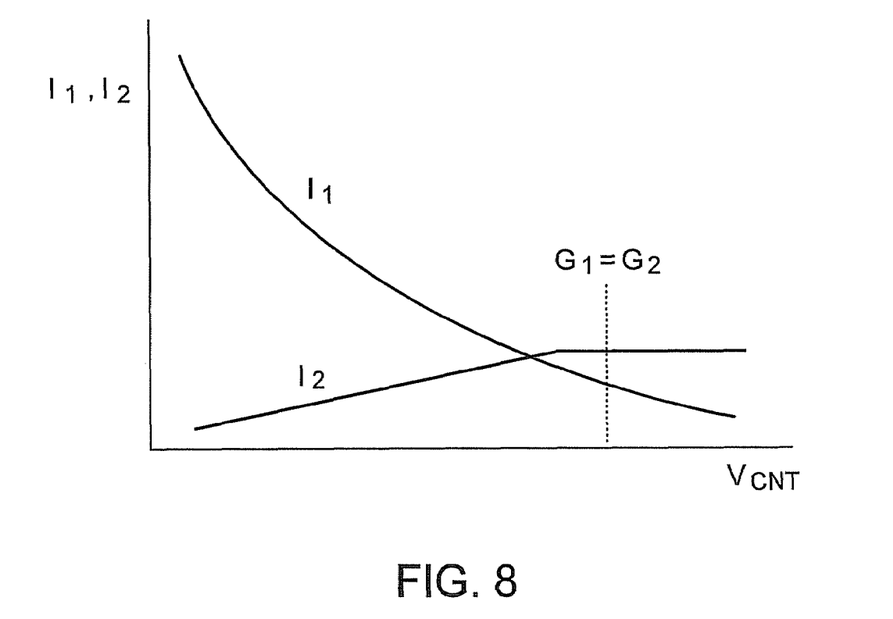
FIG. 8 shows a gain control current $I_1$ of the variable gain amplifier G1 and a gain control current $I_2$ of the amplifier G2.

With this control method, as shown in FIG. 8, the second gain control current $I_2$ increases as the gain control voltage $V_{CNT}$ increases. In other words, $I_2$=g($V_{CNT}$)=$B_1$($V_{CNT}$)× $V_{CNT}$; $B_1$($V_{CNT}$)$\geq$0 holds. However, when the transconductance of the variable gain amplifier G1 is minimized to G1min, the second gain control current $I_2$ and the gate width ratio M:K of the differential pair are set so that the peak of the transconductance gm2 of the amplifier G2 equals the peak of the transconductance G1min in the same manner as the first method in which the second gain control current $I_2$ is constant.

Since this arrangement enables the second gain control current $I_2$ of the amplifier G2 to decrease when maximum gain is set, low power consumption may be achieved. While only one pair of asymmetrical differential pairs has been considered in this case, the same result may be obtained with a plurality of pairs.

Figure 9:
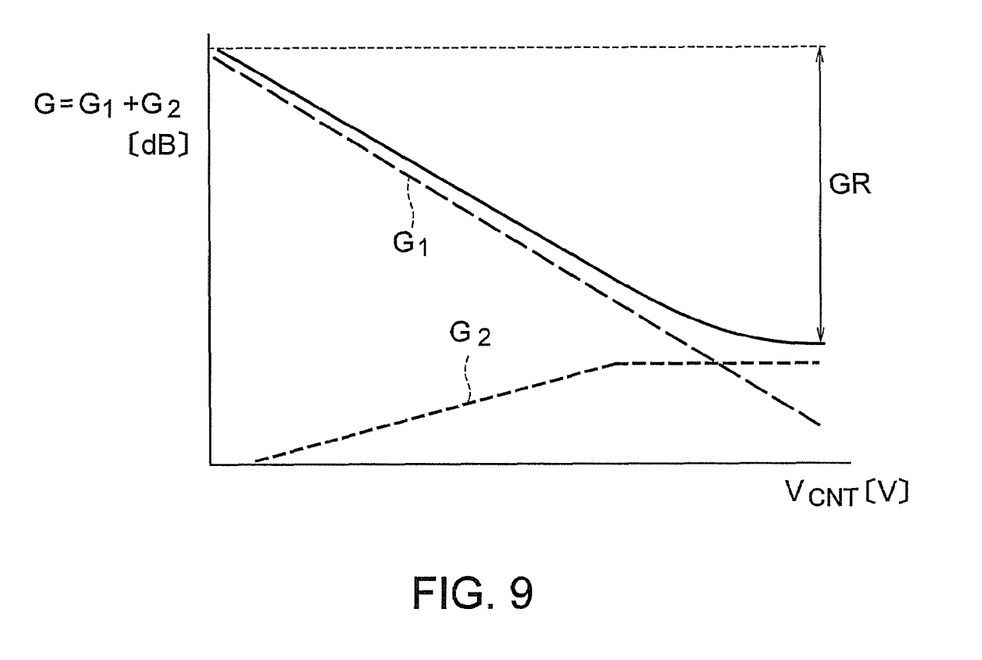
FIG. 9 shows gain control characteristics of the variable gain amplifier G1 and the amplifier G2 having square-law characteristics.

FIG. 9 shows a gain control characteristic in a case in which the variable gain amplifier G1 operates in the strong inversion region all the way down to minimum gain. As shown in FIG. 5, the variable gain amplifier G1 has a linear-in-dB gain control characteristic, while a total gain control characteristic G=G1+G2 including the amplifier G2 deviates from linear-in-dB near minimum gain. However, since this deviation is inevitable and may be anticipated, the deviation may be avoided by adjusting the gain control voltage $V_{CNT}$. In addition, in a case where high accuracy is not required for gain control characteristics, the smallness of the deviation of gain control characteristics will not pose any problems.

Figure 10:
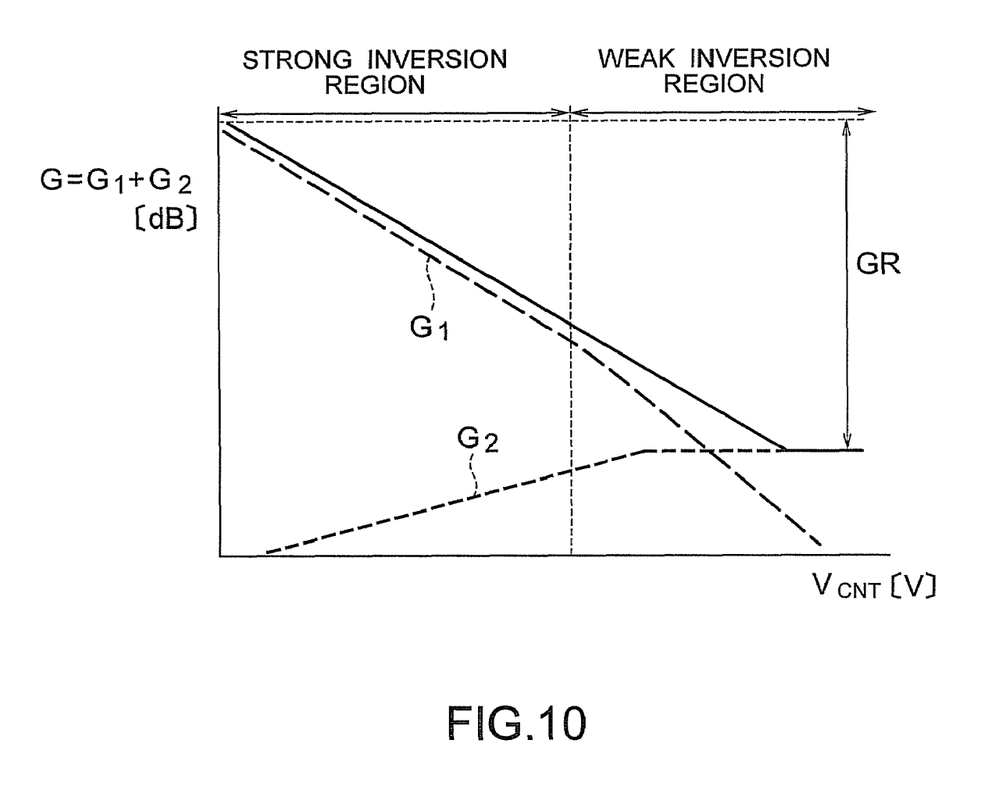
FIG. 10 shows gain control characteristics of the variable gain amplifier G1 and the amplifier G2 having square-law characteristics and exponential characteristics.

A method for decreasing the above-described deviation from the linear-in-dB gain control characteristic will be described with reference to FIG. 10. MOS transistors have strong inversion regions and weak inversion regions depending on operation conditions thereof. The input/output characteristics of the strong and weak inversion regions respectively take square and exponential characteristics. Therefore, the slope of gain changes from 1 to 2. As shown in FIG. 6, by setting minimum gain of the variable gain amplifier G1 to just inside the weak inversion region, the minimum transconductance G1min of the variable gain amplifier G1 and the peak of the transconductance gm2 of the amplifier G2 will be added. As a result, a transconductance G=G1+G2 of an entire variable gain amplifier 20 may maintain a linear-in-dB characteristic all the way down to minimum gain.

By providing the variable gain amplifiers 10 and 20 according to the present embodiment at a next stage of a quadrature modulator (FIG. 15) within a transmitter, not shown, decrease of the input range "R" may be avoided even when gain is lowered. This suppresses distortion of output signals, and in turn suppresses deterioration of modulation accuracy or increases in unwanted radiation.

As seen, according to the present embodiment, the differential pair SP1 with a gate width ratio of 1:1, the differential pair SP2 with a gate width ratio of M:K and the differential pair SP3 with a gate width ratio of K:M are parallel-connected, and the gain control current $I_1$ of the differential pair SP1 is exponentially decreased with respect to the gain control voltage $V_{CNT}$ while the gain control current $I_2$ of the differential pairs SP2 and SP3 is arranged to be a different current from the gain control current $I_1$. In addition, the gain control current $I_2$ is either set to take a constant value regardless of the gain control voltage $V_{CNT}$ or to increase with respect to the gain control voltage $V_{CNT}$. By arranging a transconductance when the gain of the differential pair SP1 at minimum gain to be equal to the transconductances of the differential pairs SP2 and SP3, linearity at minimum gain may be extended.

As seen, since the linearity of the variable gain amplifier at low gain may be extended, a wide variable range may be secured for each stage of the variable gain amplifier. As a result, since a required number of stages of the variable gain amplifier may be reduced, low power consumption may be achieved.

The above embodiment has been described using an amplifier G2 (LCC) in which a differential pair having a gate width ratio of M:K is parallel-connected with a differential pair having a gate width ratio of K:M. By extending this logic, a linear range may be further extended by respectively parallel-connecting differential pairs having gate width ratios of M1:K1 and K1:M1, parallel-connecting differential pairs having gate width ratios of M2:K2 and K2:M2, and parallel-connecting differential pairs having gate width ratios of Mn:Kn and Kn:Mn. However, for use in an RF circuit, since an increase in the number of parallel processes is accompanied by an increase in parasitic capacitance and therefore an increase in signal loss, the number of parallel processes is preferably kept small. For instance, as explained above, in many cases, the number of parallel processes is preferably 2 or, in other words, n=1.

Additionally, in the above embodiment, while a description has been given on extending input range at low gain in an application of a transmitter, there is also a need for extending input range at low gain in an application of a receiver. This is because, in the case of a receiver, control is performed so that a predetermined amplitude is obtained. For instance, as an input signal of the variable gain amplifier 10 (20) increases, gain of the variable gain amplifier 10 (20) is decreased so that an output of the variable gain amplifier 10 (20) becomes constant.

Figure 11:
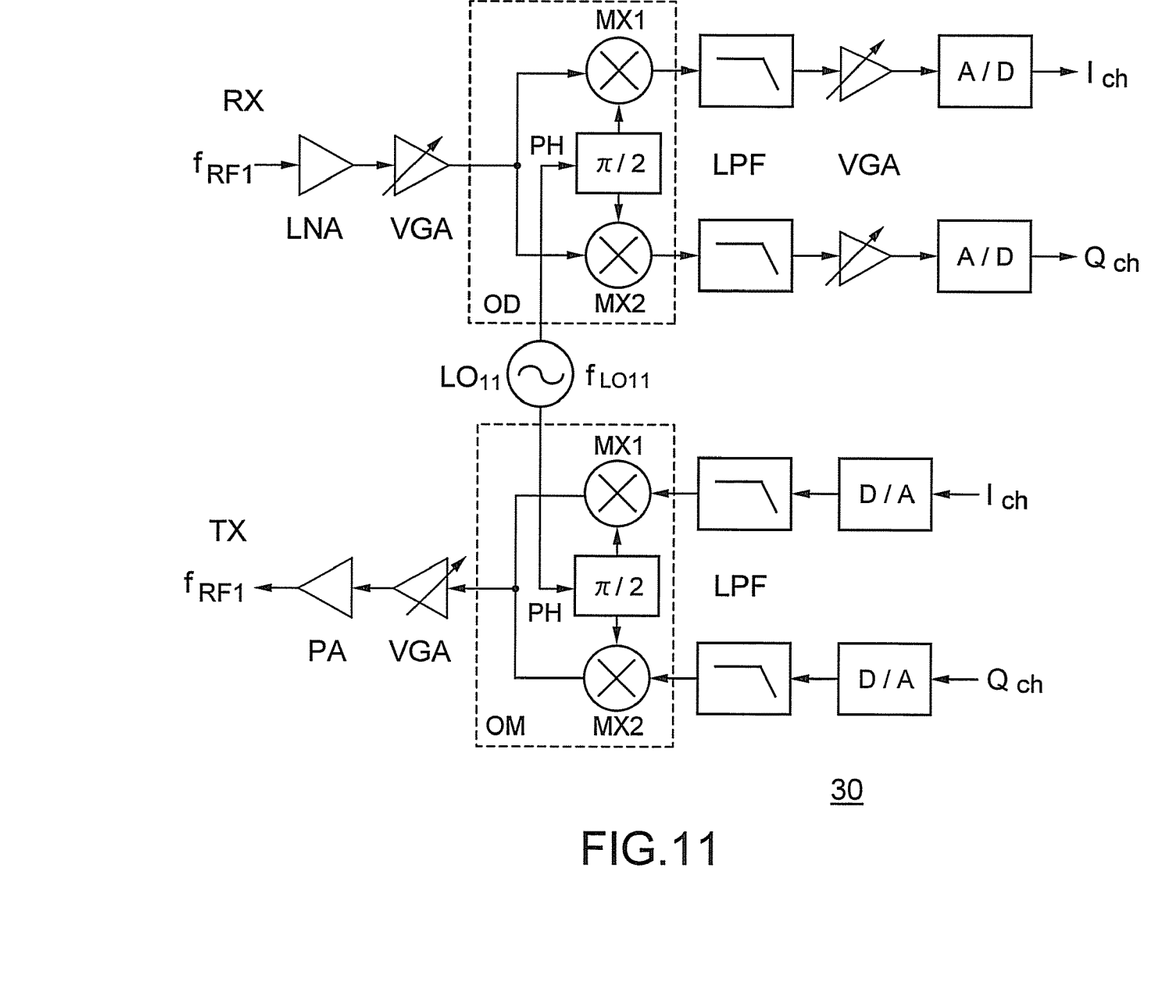
FIG. 11 shows a transmitter-receiver using a direct modulation method, which includes the variable gain amplifier according to the embodiment of the present invention.

The variable gain amplifiers 10 and 20 according to the present embodiment may be applied to a variable gain amplifier VGA of a transmitting section TX and a variable gain amplifier VGA of a receiving section. FIG. 11 shows a transmitter-receiver 30 that uses a direct modulation method.

A receiving section RX is provided at a first stage thereof with a low noise amplifier LNA having fixed gain, and amplifies a faint signal received at a low noise level. Subsequently, the signal is inputted via a variable gain amplifier VGA to a quadrature modulator OD for frequency conversion into an I/Q signal. Incidentally, the variable gain amplifier VGA may be omitted in the event that a variable gain amplification function is added to the functions of the low noise amplifier LNA. After unnecessary waves outside a desired band are removed from the I/Q signal by a lowpass filter LPF, the I/Q signal is inputted to the variable gain amplifier VGA for adjustment to an amplitude appropriate to an input level of an A/D converter.

Since the transmitting section TX is the same as that shown in FIG. 15, a description thereof will be omitted. The variable gain amplifiers 10 and 20 according to the present embodiment are applicable to the above-described variable gain amplifier VGA.

Figure 12:
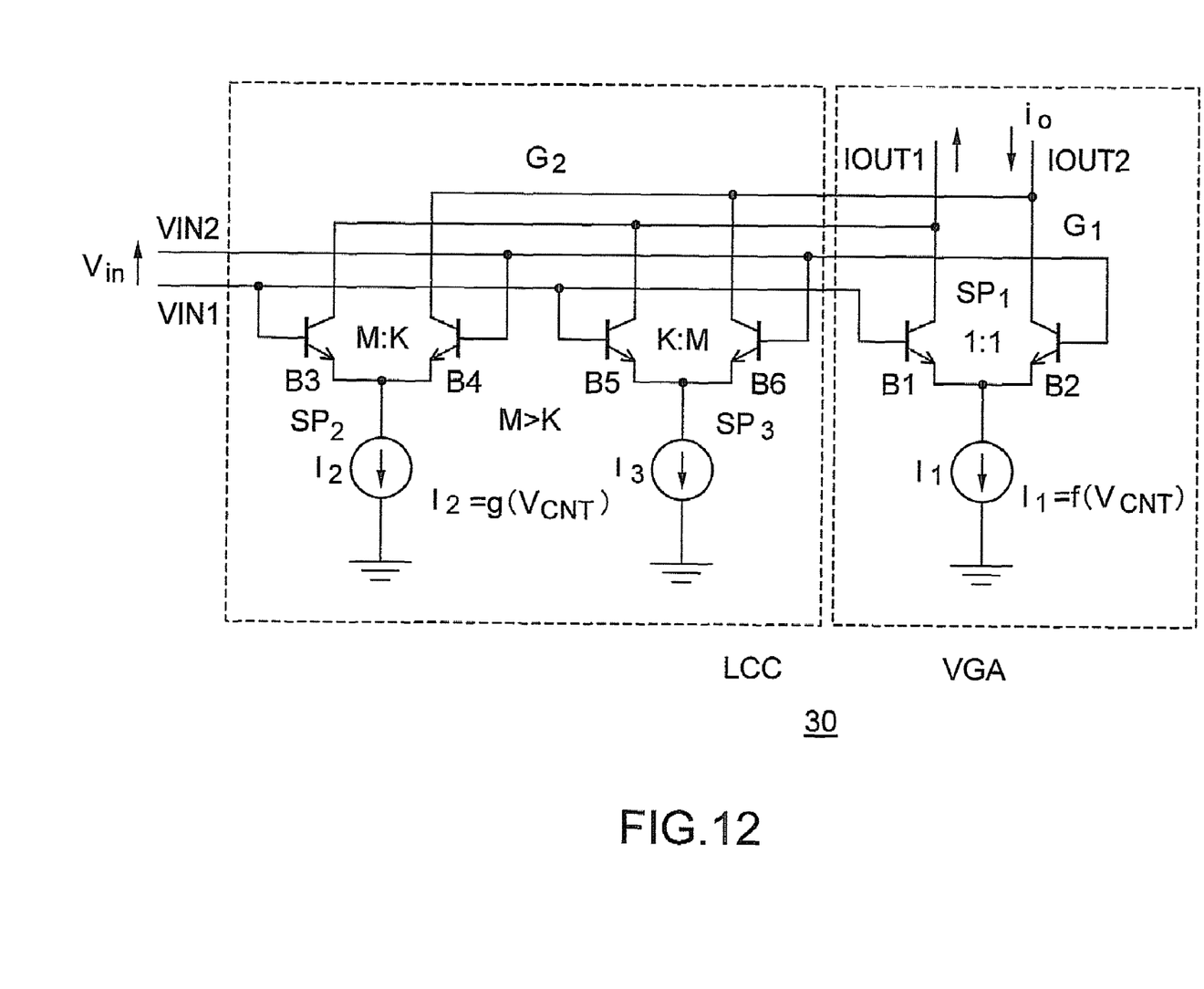
FIG. 12 is a configuration diagram of a variable gain amplifier according to another embodiment of the present invention.

Furthermore, in the above embodiment, while a description has been given on a variable gain amplifier 10 (20) that uses MOS transistors, the same effects may be achieved using bipolar transistors as shown in FIG. 12.

In this case, a variable gain amplifier (i.e. amplifier circuit) 30 is provided with: an variable gain amplifier VGA including first and second bipolar transistors B1 and B2 having approximately a same emitter area and a first current source I1; and a linearity compensation circuit LCC parallel-connected to the variable gain amplifier VGA and including third and fourth bipolar transistors B3 and B4 having different emitter areas and a second current source I2, and fifth and sixth bipolar transistors B5 and B6 having different emitter areas and a third current source I3, wherein the linearity compensation circuit LCC is formed so that a ratio between the emitter areas of the third and fourth bipolar transistors B3 and B4 are approximately the same as a ratio between the emitter areas of the fifth and sixth bipolar transistors B5 and B6.

In other words, emitters of the first and second bipolar transistors B1 and B2 are commonly connected and also connected to the first current source I1, emitters of third and fourth bipolar transistors B3 and B4 are commonly connected and also connected to the second current source I2, and emitters of fifth and sixth bipolar transistors B5 and B6 are commonly connected and also connected to the third current source I3.

Bases of the first, third and fifth bipolar transistors B1, B3 and B5 are commonly connected and also connected to a first voltage input terminal VIN1, and bases of the second, fourth and sixth bipolar transistors B2, B4 and B6 are commonly connected and also connected to a second voltage input terminal VIN2.

Collectors of the first, third and fifth bipolar transistors B1, B3 and B5 are commonly connected and also connected to a first current output terminal IOUT1, and collectors of the second, fourth and sixth bipolar transistors B2, B4 and B6 are commonly connected and also connected to a second current output terminal IOUT2.

The first current source I1 creates a first gain control current $I_1$ based on an externally applied gain control voltage $V_{CNT}$ so that the first gain control current $I_1$ decreases as the gain control voltage $V_{CNT}$ increases.

The second and third current sources I2 and I3 respectively generate a second gain control current $I_2$ having approximately a same current value, and have different current characteristics indicating a relationship between the gain control voltage $V_{CNT}$ and the gain control currents $I_1$ to $I_2$ from that of the first current source $I_1$.

In other words, the variable gain amplifier G1 is a variable gain amplifier having a linear-in-dB characteristic, and the amplifier G2 improves linearity of the variable gain amplifier G1 during low gain.

In this case, the gain control current $I_2=g(V_{CNT})$ that controls gain of the amplifier G2 differs from the gain control current $I_1=f(V_{CNT})$ of the variable gain amplifier G1.

Although the above-described embodiment has been limited in that MOS transistors during maximum gain have square-law characteristics, the present embodiment will be equally valid when the operation regions of the MOS transistors during maximum gain take exponential characteristics. However, while an input/output characteristic of a MOS transistor changes according to operation regions, an operation region of a bipolar transistor remains unchanged. Therefore, correction of a linear-in-dB characteristic as shown in FIG. 6 or 10 may not be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit comprising:
   a first differential amplifier circuit including a first transistor having a gate terminal forming a first input node, a second transistor having a gate terminal forming a second input node and having a dimensional ratio with respect to the first transistor of K:M (where K>M), and a first current source that supplies a first current to a source terminal of the first transistor and a source terminal of the second transistor, wherein K and M represent gate width;
   a second differential amplifier circuit including a third transistor having a gate terminal forming a third input node, a fourth transistor having a gate terminal forming a fourth input node and having a dimensional ratio with respect to the third transistor of M:K, and a second current source that supplies a second current to a source terminal of the third transistor and a source terminal of the fourth transistor, the second differential amplifier circuit having the same gain as the first differential amplifier circuit; and
   a third differential amplifier circuit including a fifth transistor having a gate terminal forming a fifth input node, a sixth transistor having a gate terminal forming a sixth input node and having a dimensional ratio with respect to the fifth transistor of 1:1, and a variable current source that supplies a third current to a source terminal of the fifth transistor and a source terminal of the sixth transistor, the third differential amplifier circuit combining the third current and the fifth transistor so that a gain of the third differential amplifier circuit is greater than a gain of the first differential amplifier circuit when the third current is a first magnitude, and the gain of the third differential amplifier circuit is lower than the gain of the first differential amplifier circuit when the third current is a second magnitude that differs from the first magnitude, wherein
   the first input node, the third input node and the fifth input node are mutually connected to form one node of a differential input node;
   the second input node, the fourth input node and the sixth input node are mutually connected to form an other node of the differential input node;
   a drain terminal of the first transistor, a drain terminal of the third transistor and a drain terminal of the fifth transistor are mutually connected to form one node of a differential output node; and
   a drain terminal of the second transistor, a drain terminal of the fourth transistor and a drain terminal of the sixth transistor are mutually connected to form an other node of the differential output node.

2. The amplifier circuit according to claim 1, wherein the variable current source supplies a third current having an exponential relationship with a control voltage that has a linear relationship with an output current of the differential output node.

3. The amplifier circuit according to claim 2, wherein
   the variable current source exponentially decreases the third current as the control voltage increases, and
   the first and second current sources respectively generate first and second currents having approximately a same value.

4. The amplifier circuit according to claim 2, wherein
   the variable current source exponentially decreases the third current as the control voltage increases, and
   the first and second current sources respectively generate first and second currents so that the first and second currents monotonously increase as the control voltage increases.

5. The amplifier circuit according to claim 1, further comprising:
   a fourth differential amplifier circuit including a seventh transistor having a gate terminal forming a seventh input node, an eighth transistor having a gate terminal forming an eighth input node and having a dimensional ratio with respect to the seventh transistor of K:M (where K≠M), and a fourth current source that supplies a fourth current to a source terminal of the seventh transistor and a source terminal of the eighth transistor, wherein
   the seventh input node is connected to the one node of the differential input node,
   the eighth input node is connected to the other node of the differential input node,
   a drain terminal of the seventh transistor forms the one node of the differential output node, and
   a drain terminal of the eighth transistor forms the other node of the differential output node.

6. The amplifier circuit according to claim 1, wherein
   the first and second transistors are formed by MOS transistors, and
   the first differential amplifier circuit operates the first and second transistors in a strong inversion region near maximum gain among a gain range in which gain is changeable by the first differential amplifier circuit and operates the first and second transistors in a weak inversion region near minimum gain among the gain range in which gain is changeable by the first differential amplifier circuit.

7. An amplifier circuit comprising:
   a first differential amplifier circuit including a first transistor having a base terminal forming a first input node, a second transistor having a base terminal forming a second input node and having a dimensional ratio with respect to the first transistor of K:M (where K>M), and a first current source that supplies a first current to an emitter terminal of the first transistor and an emitter terminal of the second transistor, wherein K and M represent emitter area;
   a second differential amplifier circuit including a third transistor having a base terminal forming a third input node, a fourth transistor having a base terminal forming a fourth input node and having a dimensional ratio with respect to the third transistor of M:K, and a second current source that supplies a second current to an emitter terminal of the third transistor and an emitter terminal of the fourth transistor, the second differential amplifier circuit having the same gain as the first differential amplifier circuit; and a third differential amplifier circuit including a fifth transistor having a base terminal forming a fifth input node, a sixth transistor having a base terminal forming a sixth input node and having a dimensional ratio with respect to the fifth transistor of 1:1, and a variable current source that supplies a third current to an emitter terminal of the fifth transistor and an emitter terminal of the sixth transistor, the third differential amplifier circuit combining the third current and the fifth transistor so that a gain of the third differential amplifier circuit is greater than a gain of the first differential amplifier circuit when the third current is a first magnitude, and the gain of the third differential amplifier circuit is lower than the gain of the first differential amplifier circuit when the third current is a second magnitude that differs from the first magnitude, wherein the first input node, the third input node and the fifth input node are mutually connected to form one node of a differential input node;

the second input node, the fourth input node and the sixth input node are mutually connected to form an other node of the differential input node;

a collector terminal of the first transistor, a collector terminal of the third transistor and a collector terminal of the fifth transistor are mutually connected to form one node of a differential output node; and a collector terminal of the second transistor, a collector terminal of the fourth transistor and a collector terminal of the sixth transistor are mutually connected to form an other node of the differential output node.

8. A communication device including a transmitter circuit having a modulator, in which an amplifier circuit is connected to a next stage of the modulator, the amplifier circuit comprising:

a first differential amplifier circuit including a first transistor having a gate terminal forming a first input node, a second transistor having a gate terminal forming a second input node and having a dimensional ratio with respect to the first transistor of K:M (where K>M), and a first current source that supplies a first current to a source terminal of the first transistor and a source terminal of the second transistor, wherein K and M represent gate width;

a second differential amplifier circuit including a third transistor having a gate terminal forming a third input node, a fourth transistor having a gate terminal forming a fourth input node and having a dimensional ratio with respect to the third transistor of M:K, and a second current source that supplies a second current to a source terminal of the third transistor and a source terminal of the fourth transistor, the second differential amplifier circuit having the same gain as the first differential amplifier circuit; and a third differential amplifier circuit including a fifth transistor having a gate terminal forming a fifth input node, a sixth transistor having a gate terminal forming a sixth input node and having a dimensional ratio with respect to the fifth transistor of 1:1, and a variable current source that supplies a third current to a source terminal of the fifth transistor and a source terminal of the sixth transistor, the third differential amplifier circuit combining the third current and the fifth transistor so that a gain of the third differential amplifier circuit is greater than a gain of the first differential amplifier circuit when the third current is a first magnitude, and the gain of the third differential amplifier circuit is lower than the gain of the first differential amplifier circuit when the third current is a second magnitude that differs from the first magnitude; wherein the first input node, the third input node and the fifth input node are mutually connected to form one node of a differential input node;

the second input node, the fourth input node and the sixth input node are mutually connected to form an other node of the differential input node;

a drain terminal of the first transistor, a drain terminal of the third transistor and a drain terminal of the fifth transistor are mutually connected to form one node of a differential output node; and a drain terminal of the second transistor, a drain terminal of the fourth transistor and a drain terminal of the sixth transistor are mutually connected to form an other node of the differential output node.

* * * * *